(12) United States Patent
Isago et al.

(10) Patent No.: US 7,288,156 B2
(45) Date of Patent: Oct. 30, 2007

(54) METHODS FOR CLEANING A SUBSTRATE

(75) Inventors: Yoichi Isago, Kanagawa (JP); Kazuo Nojiri, Tokyo (JP); Naoaki Kobayashi, Chiba (JP); Teruo Saito, Chiba (JP); Shu Nakajima, Kanagawa-ken (JP)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/330,004

(22) Filed: Jan. 10, 2006

(65) Prior Publication Data

US 2006/0112974 A1    Jun. 1, 2006

Related U.S. Application Data

(62) Division of application No. 10/229,931, filed on Aug. 27, 2002, now Pat. No. 7,004,181.

(30) Foreign Application Priority Data

Aug. 31, 2001  (JP)  ............................. 2001-264627

(51) Int. Cl.
*B08B 3/00* (2006.01)
*B08B 3/02* (2006.01)
*B08B 5/00* (2006.01)

(52) U.S. Cl. ........................... 134/36; 134/30; 134/31; 134/37

(58) Field of Classification Search ............. 134/30–37
See application file for complete search history.

(56) References Cited

U.S. PATENT DOCUMENTS

| | | | |
|---|---|---|---|
| 5,887,605 A * | 3/1999 | Lee et al. ................. | 134/102.2 |
| 6,589,359 B2 * | 7/2003 | Kamikawa et al. ........... | 134/26 |
| 6,610,168 B1 * | 8/2003 | Miki et al. ................... | 156/344 |

* cited by examiner

*Primary Examiner*—Jill Warden
*Assistant Examiner*—Saeed Chaudhry
(74) *Attorney, Agent, or Firm*—IP Strategy Group, P.C.

(57) ABSTRACT

The invention provides a water supplying apparatus and method thereof which has a high capacity of peeling and removing a disused material such as a resist film and the like, and can efficiently use water vapor. A water supplying apparatus for executing a washing process, a cleaning process and a working process of a subject, is provided with a water vapor body supplying means for supplying a water vapor body, and a water mist body supplying means for supplying a water mist body containing liquid water fine particles, and the structure is made such that said water vapor body and said water mist body are supplied to the subject by independently controlling said two means.

16 Claims, 7 Drawing Sheets

METHODS FOR CLEANING A SUBSTRATE

REFERENCE TO RELATED APPLICATION

This application claims the priority right under 35 USC 120 from U.S. application Ser. No. 10/229,931, filed on Aug. 27, 2002 now U.S. Pat. No. 7,004,181, which claims the priority right under 35 USC 119 from Japanese Patent Application No. 2001-264627 filed on Aug. 31, 2001, all of which are incorporated herein by reference.

BACKGROUND OF THE INVENTION

1. Field of the Invention

The present invention relates to an apparatus for supplying water ($H_2O$) in a manufacturing process of a product, and relates to an apparatus for supplying high purity water used for a working process of a product surface and a washing and cleaning process thereof. More particularly, the present invention relates to a water supplying apparatus and a method thereof for peeling out a disused material such as a resist film, a polymer residue or the like attached to a subject surface such as a semiconductor wafer, a hard disc (HD), a liquid crystal display (LCD), a flat panel display (FPD) or the like in a lithography process so as to remove.

2. Description of the Related Art

In a manufacturing process of a semiconductor apparatus, a liquid crystal display, a magnetic disc, a printed circuit board or the like, a resist is applied to a surface of the subject and a high-precision process such as a pattern forming or the like is applied to the surface of the subject by using a lithography. Thereafter, a process of removing the disused material such as the resist film, the polymer residue or the like attached to the surface of the subject is executed.

As a technique of removing the disused material such as the resist film or the like which has been conventionally executed, there are a plasma asher method of ashing and removing the resist film by oxygen plasma, a method of thermally removing a film body by an organic solvent (a phenol solvent, a halogen solvent or the like), a thermally dissolving method executed by concentrated sulfuric acid and hydrogen peroxide, and the like.

However, in any of the methods mentioned above, a time, an energy and a chemical material for disassembling and dissolving the resist film and the like are required, and a load in the process of disassembling and dissolving the resist film and the like is great. The plasma asher method is generally well known, however, there is a problem that a charge-up damage generated by charged particles is great. Further, since there is a problem that it is impossible to sufficiently remove a reaction product (a polymer residue) generated in an etching process, it is necessary to wet remove this, so that there is a problem that a number of processes is increased. Accordingly, in a field of a precision surface treatment technique including a technique of removing the disused material such as the resist film and the like, a great attention is paid to a method of using water and water vapor which are rich in the natural world, as a technique casting off from the prior art using the chemical material and the chemical process and being gentle for the earth and the environment, and there is an expectation of using and developing the technique.

A technique of removing the resist film remaining on the surface of the semiconductor apparatus, the liquid crystal device or the like by using the water vapor is described in Japanese Unexamined Patent Publication No. 2001-118817. In accordance with the publication mentioned above, there is disclosed a technique of lifting off the residual resist film from the surface of the subject by high temperature mist in the water vapor so as to remove it.

However, in order to completely peel out and remove the resist film, it is necessary to generate a lot of water vapor, so that there is a disadvantage that an electric power consumption is too large.

As a result of devoting themselves to and taking into consideration a mechanism of peeling out and removing the resist film by using the water vapor, the inventors of the present application have noted that the peeling and removing process of the resist film is constituted by the following two steps.

That is, at first, vaporized water (this is called as a water vapor body) permeates through the resist film so as to reach an interface between the resist film and the surface of the subject, thereby weakening a bonding force of the resist film on this interface and floating the resist film from the surface of the subject (lifting off).

Next, mist-like water containing liquid water fine particles together with a predetermined injection pressure (this is called as a water mist body) physically acts on the lifted off resist film so as to peel out the resist film from the interface.

Since the water vapor body and the water mist body have different roles in the peeling and removing process of the resist film as mentioned above, if it is possible to control the water vapor body and the water mist body most appropriately so as to generate them, a lot of water is not required and it is possible to reduce electric power consumption.

That is, the water vapor body requires an application of a high temperature and a high energy for the purpose of permeating through the resist film, however, the amount to be required is a little. Accordingly, it is possible to generate the water vapor body by a little electric power consumption.

On the contrary, since the water mist body is used for physically peeling out the lifted off resist film, the amount to be required is more than that of the water vapor body, however, it is not necessary to heat to a high temperature, and it is only necessary that a predetermined injection pressure is applied, so that the electric power consumption for the generation is hardly required.

In this regard, in the method of utilizing the water vapor described in the publication mentioned above, since the water mist body and the water vapor body exist in a mixed state without being controlled to the respective optimum conditions, efficiency has been deteriorated.

SUMMARY OF THE INVENTION

The present invention is made on the basis of the knowledge mentioned above, and an object of the present invention is to provide a water supplying apparatus and method thereof which has a high capacity of peeling and removing a disused material such as a resist film, a polymer residue and the like, and can efficiently remove the disused material.

The water supplying apparatus in accordance with the present invention employs the following means in order to solve the problems mentioned above.

(1) A water supplying apparatus for executing a washing process, a cleaning process and a working process of a subject, comprising:

a water vapor body supplying means for supplying a water vapor body; and a water mist body supplying means for supplying a water mist body containing liquid water fine particles, wherein the water vapor body and the water mist body are supplied to the subject by independently controlling the two means.

(2) A water supplying apparatus as recited in the item (1), wherein the subject includes a disused material of a resist film and a polymer residue which are generated in connection with manufacture of a semiconductor device.

(3) A water supplying apparatus as recited in the items (1) and/or (2), wherein the water vapor body or the water mist body is supplied in a state of being contained in a gas.

(4) A water supplying apparatus as recited in the item (2) or (3), further comprising a contacting and/or permeating means for contacting and/or permeating the water vapor body with respect to the subject, and an injecting means for injecting the water mist body to the subject, wherein the disused material is removed on the basis of a cooperation between the water vapor body and the water mist body.

(5) A water supplying apparatus as recited in any one of the items (1) to (4), further comprising a nozzle means for supplying the water vapor body and/or the water mist body to the subject.

(6) A water supplying apparatus as recited in the item (5), wherein the nozzle means is arranged so as to be opposed to the subject placed within a processing chamber.

(7) A water supplying apparatus as recited in the item (5) or (6), wherein the nozzle means is constituted by a two-fluid mixture injecting nozzle provided with a first flow passage for passing the water vapor body therethrough and a second flow passage passing the water mist body therethrough.

(8) A water supplying apparatus as recited in the item (5) or (6), wherein the nozzle means is constituted by a two-fluid mixture injecting nozzle provided with a first flow passage for passing the water vapor body therethrough and a second flow passage for passing the liquid water therethrough. In accordance with this structure, it is possible to generate a water mist containing liquid water fine particles in a gas by passing the liquid water therethrough and injecting the liquid water from a discharge port.

(9) A water supplying apparatus as recited in the item (7) or (8), wherein the two-fluid mixture injecting nozzle is provided with a mixing portion for mixing the water vapor body and the water mist body.

(10) A water supplying apparatus as recited in any one of the items (3) to (9), wherein the gas is constituted by any one of air, nitrogen, argon, carbon dioxide, ozone and helium, or a combination of at least two elements.

(11) A water supplying apparatus as recited in any one of the items (1) to (10), wherein the water vapor body is controlled so that a temperature becomes equal to or more than a boiling point, and the water mist body is controlled so that a temperature becomes equal to or less than a boiling point.

(12) A water supplying apparatus as recited in any one of the items (1) to (11), wherein the liquid water fine particles contain ozone, carbon dioxide, ion, acid or an alkaline material.

(13) A water supplying apparatus as recited in any one of the items (1) to (12), further comprising an air pressure controlling means for controlling an inner portion of the processing chamber in an atmospheric pressure state, a depressurized state or a pressurized state.

(14) A water supplying method for executing a washing process, a cleaning process and a working process of a subject, comprising the steps of:

contacting a water vapor body containing vaporized water in a gas with a surface of the subject and permeating the water vapor body through the subject;

injecting a water mist body containing liquid water fine particles in a gas onto the surface of the subject; and removing a disused material from the subject on the basis of a cooperation between the water vapor body and the water mist body.

(15) A water supplying method as recited in the item (14), wherein the disused material is removed within a chamber an air pressure of which is controlled in a depressurized state, a normal pressure state or a pressurized state.

(16) A water supplying method as recited in the item (14), wherein the water vapor body is controlled so that a temperature becomes equal to or more than a boiling point, and the water mist body is controlled so that a temperature becomes equal to or less than a boiling point.

DESCRIPTION OF THE PREFERRED EMBODIMENTS

Next, a description will be given of an embodiment of a water supplying apparatus and a water supplying method in accordance with the present invention with reference to FIGS. 1 to 7.

Figure 7:
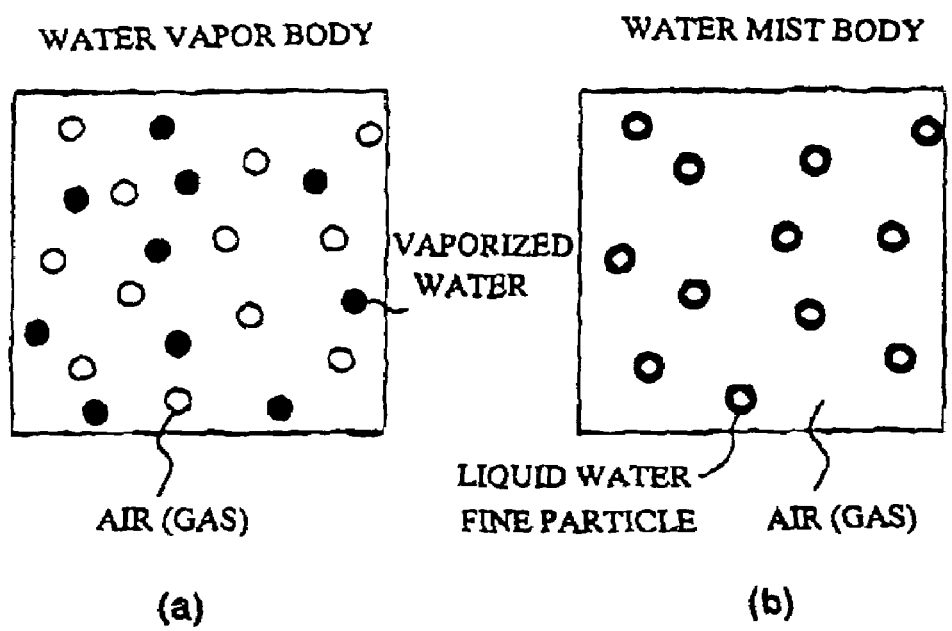
FIG. 7 is a pattern schematic view of a water vapor body and a water mist body.

FIG. 7 is a view showing a pattern structure of a water vapor body and a water mist body which are used in the present invention. The water vapor body in this case generally exists in a state that heated and vaporized water (vaporized water ($H_2O$ molecule) is contained in the gas such as air or the like as shown in FIG. 7(a), however, it is also possible to be constituted by 100% water vapor containing no gas. Further, the water mist body exists in a state that liquid-like water fine particles are contained in the gas, as shown in FIG. 7(b).

In order to generate the water vapor body containing the vaporized water in the gas, for example, it is possible to generate by dropping liquid water on a heated plate so as to vaporize this, and it is also possible to generate by generating the water vapor so as to heat it. A temperature of the water vapor body is controlled so as to be equal to or more than 100° under the atmospheric pressure, preferably between 130° and 160°.

The water mist body can be generated, for example, by vigorously injecting water at a room temperature or a mixture of the water and the gas from a nozzle, or can be generated by utilizing so-called spray principle injecting the gas to a portion near an injection port of the water.

Further, it is preferable to set a temperature of the water mist body to be equal or less than 100° under the atmospheric pressure.

In this case, as mentioned below, in the case of applying the water vapor body and the water mist body to a subject within a process chamber, it is possible to control an inner portion of the chamber in the atmospheric pressure state, a depressurized state and a pressurized state, and in this case, the temperatures of the water vapor body and the water mist body can be changed by the pressure within the chamber. Accordingly, the temperature of the water vapor body can be controlled so as to be equal to or more than a boiling point thereof, and the temperature of the water mist body can be controlled so as to be equal to or less than a boiling point thereof. Further, in the water vapor body containing the water vaporized in the gas, the vaporized water is normally contained in the air, however, it is not limited to the air, and a gas such as nitrogen, argon, helium and the like may be employed. The same matter can be applied to the air in the water mist body.

Further, a method of producing the water mist body including the liquid water fine particles containing ozone, carbon dioxide, ion, acid or an alkaline material has the following three ways in a wide view.

(1) It is possible to produce the water mist body by using the liquid water previously containing the material mentioned above.

(2) It is possible to produce the water mist body containing the material mentioned above by being contacted with and absorbed in the water so as to inject the gas forming the water containing the material mentioned above from the nozzle together with the liquid water, thereby generating the water mist body.

(3) It is possible to produce the water mist body containing the material mentioned above by being contacted with and absorbed in the water after making the water mist body containing nothing so as to be contacted with the gas forming the water containing the material mentioned above.

Further, by using the water mist body mentioned above, it is possible to promote prevention and removal of a charge-up of an electric charge to the subject during a step of removing a disused material such as the resist or the like.

FIG. 1(a) shows an embodiment of a structure of a nozzle means used in a water supplying apparatus in accordance with the present invention. In this embodiment, two nozzles 10 and 12 are independently prepared. Further, a supplied material A is a water vapor body supplied to the nozzle 10 and a supplied material B is a water mist body supplied to the nozzle 12. In this case, the nozzle 10 and the nozzle 12 are arranged close to a subject (not shown).

The water vapor body injected from the nozzle 10 reaches a surface of the subject and permeates through the disused material such as the resist film or the like so as to weaken a bonding force between the disused material and a substrate on an interface.

Further, the water mist body injecting from the nozzle 12 is injected to the surface of the subject accompanied with a predetermined pressure so as to peel and remove the disused material such as the resist film or the like having a weakened bonding force with respect to the interface.

Further, in accordance with a research and experiment by the inventors, it is found that a high peeling effect can be obtained when the temperature of the water vapor body is over 100° and between 120° and 180° and the temperature of the water mist body is equal to or less than 100°, and it is possible to realize a removing apparatus of the disused material such as the resist film or the like with a high efficiency by controlling so as to set to this condition.

In the manner mentioned above, in accordance with the water supplying apparatus of the present invention, the apparatus is structured such as to properly and effectively supply the water vapor body and the water mist body to the subject by providing a means for supplying the water vapor body in one nozzle and providing a means for supplying the water mist body in another nozzle, and combining these two means so as to independently control them.

In this case, in FIG. 1(a), the description is given on the assumption that the supplied material A is the water vapor body supplied to the nozzle 10, and the supplied material B is the water mist body supplied to the nozzle 12, however, the supplied material A may be of course the water mist body supplied to the nozzle 10, and the supplied material B is the water vapor body supplied to the nozzle 12.

FIGS. 1(b) and 1(c) show another embodiment of the structure of the nozzle means used in the water supplying apparatus in accordance with the present invention. A nozzle 18 in FIG. 1(b) or a nozzle 16 in FIG. 1(c) corresponds to any one of two nozzles 10 and 12 in FIG. 1(a).

FIG. 1(c) shows a state that a water mist body c2 itself produced in the other place for supplying the water mist body c2 is supplied through the nozzle 16.

Further, FIG. 1(b) shows a nozzle apparatus having a structure made such that an inner portion of the nozzle 18 is separated into a center side supplying portion 18b and an outer side supplying portion 18b and a water mist body c1 is produced within the nozzle 18 so as to supply. In order to produce the water mist body within the nozzle by using the structure mentioned above, for example, the liquid water and the water vapor may be mixed so as to produce, or it is possible to produce by mixing the liquid water and the gas. Accordingly, in the nozzle 18, the structure may be made such as to respectively supply two kinds of materials to the center side supplying portion 18b and the outer side supplying portion 18a in a branched manner, whereby the materials are mixed near the injection port and the water mist body c1 is obtained.

Figure 1:
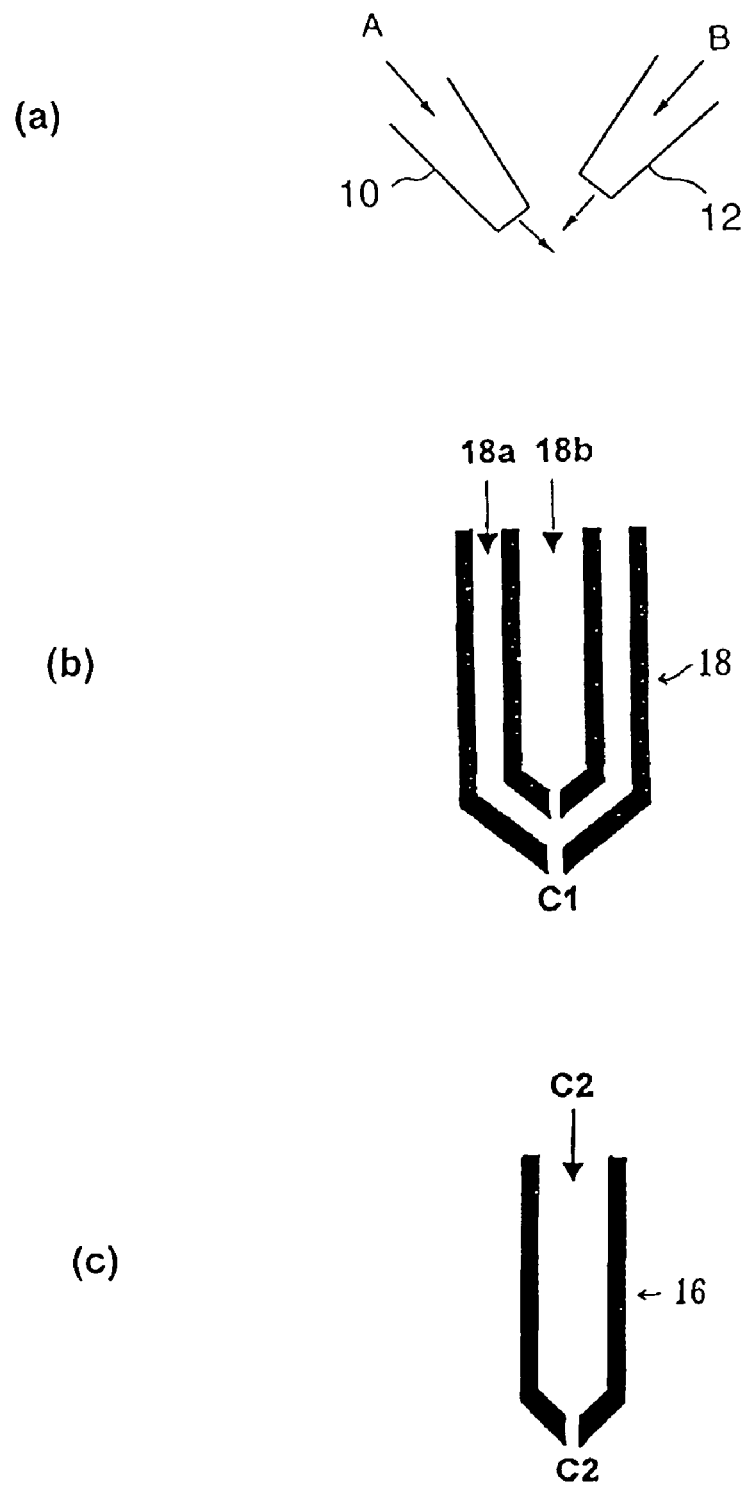
FIG. 1 is a schematic view showing an embodiment of a nozzle means employed in a water supplying apparatus in accordance with the present invention.
Figure 2:
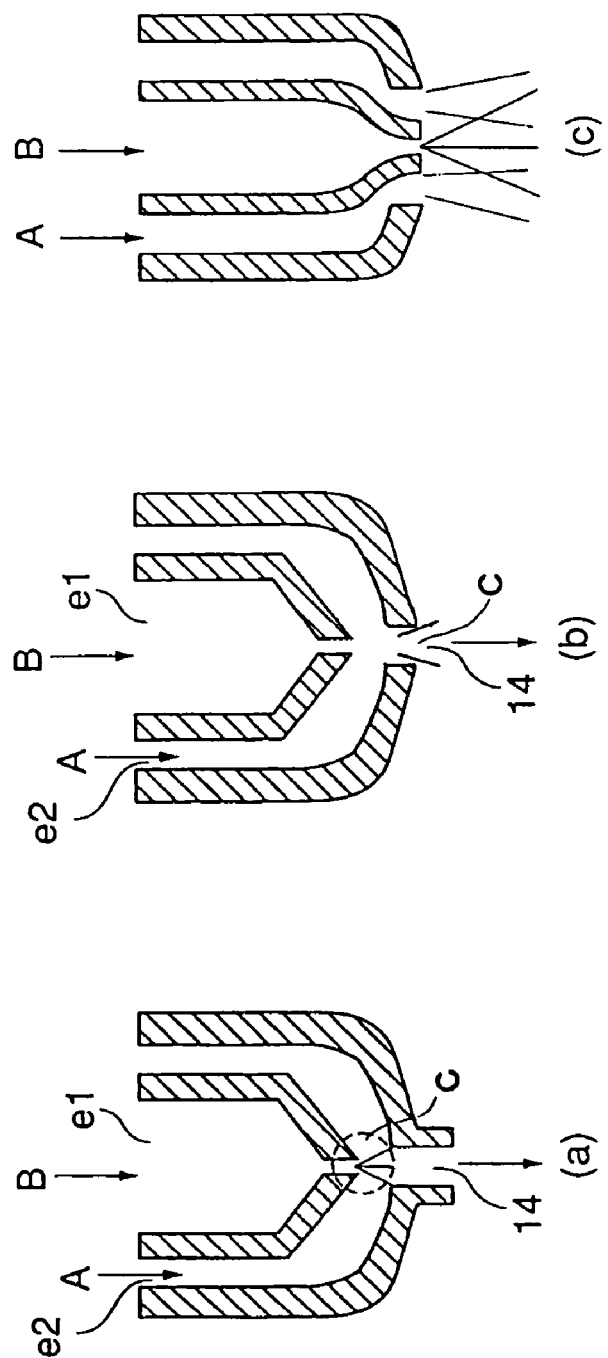
FIG. 2 is a cross sectional schematic view of a two-fluid mixture injecting nozzle apparatus corresponding to an embodiment of a nozzle apparatus employed in the water supplying apparatus in accordance with the present invention.

FIG. 2 is a view showing an embodiment of the nozzle apparatus used in the water supplying apparatus in accordance with the present invention by using a cross section.

In a nozzle apparatus shown in FIG. 2(a), liquid water in a high-pressure state is supplied as the supplied material B from a center supply port e1. Further, the water vapor is supplied as the supplied material A from a side supply port e2. Further, in a portion (a portion shown by a dotted circle in the drawing) near a discharge port of the nozzle apparatus, the water vapor body A and the liquid water B are mixed, and a water mist body C is formed and injected from an injection port.

In the nozzle apparatus shown in FIG. 2(a), one nozzle apparatus is provided, however, is provided with two means constituted by a means for supplying the water vapor body and a means for supplying the water mist body. In this case, the water mist body C in this nozzle apparatus is not supplied from the other place after previously produced, but the water mist body C is produced on the basis of the discharge of the liquid water B. Accordingly, in this case, by controlling the supply of the water vapor body A and the liquid water B, it is possible to independently control the means for supplying the water vapor body and the means for supplying the water mist body, and two means can be variously combined.

In the nozzle apparatus shown in FIG. 2(b), the water vapor is supplied as the supplied material B from the center supply port e1. Further, the liquid water is supplied as the supplied material A from the side supply port e2. Further, in a portion (a portion shown by reference 14 in the drawing) near the discharge port of the nozzle apparatus, the water vapor body B and the liquid water A are mixed, whereby the water mist body C is produced and is injected out from the injection port 14.

In FIGS. 2(b) and 2(a), both of the structures are made such that the water vapor body and the liquid water are respectively supplied from different supply ports (e1, e2), however, the apparatuses themselves have no great difference.

Accordingly, in FIG. 2(b), by controlling the supply of the water vapor body A and the liquid water B, it is possible to independently control two means constituted by the means for supplying the water vapor body and the means for supplying the water mist body, and two means can be variously combined.

FIG. 2(c) shows a further nozzle structure. In this nozzle structure, the water vapor body and the liquid water are not mixed as is different from FIGS. 2(a) and 2(b), and accordingly, the mixing portion is not provided. In this case, the structure is made such that the water vapor body and the water mist body are respectively discharged to the external portion directly so as to be injected to the subject. Further, as the supplied material A and the supplied material B, any one of the water vapor body and the water mist body is applied as the supplied material, whereby the nozzle apparatus is structured.

The nozzle apparatuses exemplified in FIGS. 2(a), 2(b) and 2(c) are called as two-fluid mixture injection nozzles, however, a shape of the two-fluid mixture injection nozzle capable of being used in the present invention is not limited to this, and can be variously modified. In any case, the structure can be employed as far as it is possible to independently control the amount of supply, the temperature, the injection pressure of the water vapor body and the water mist body.

Then, there is shown here one embodiment among the researches and experiments executed by the inventors.

A state that the water mist body (the fine particles) and the water vapor body (the water vapor gas body) exist together is prepared by heating pure water of 400 cc/minute by using a pure water heating apparatus having a processing capacity of 400 cc/minute, and a desirable result of removing a resist film can be obtained at a time of injecting the water mist body and the water vapor body to the semiconductor wafer to which the resist film is attached, via the nozzle apparatus. A weight ratio between the water vapor body and the water mist body at this time is 25:75.

Figure 3:
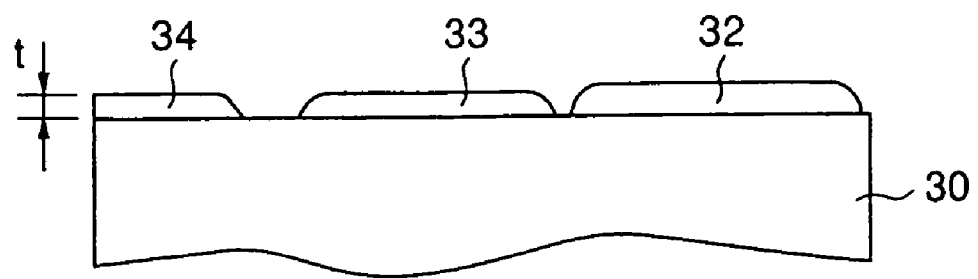
FIG. 3 is a cross sectional view of a wafer to which a resist film is attached, showing an embodiment of a subject to which a water vapor body and a water mist body are supplied in connection with the present invention.

FIG. 3 shows an embodiment of the subject to which the water vapor body and the water mist body are supplied in connection with the present invention, and is a cross sectional view of the wafer to which the resist film is attached. The resist film 32, 33 and 34 are closely adhered onto the wafer 30 so as to form hard film layers, and a thickness thereof is normally about 500 to 800 nm.

The wafer to which the resist films are attached as shown in FIG. 3 corresponds to one example of the subject in the water supplying apparatus in accordance with the present invention, and a resist film removal after an ion implantation can be significantly effectively executed by using the water supplying apparatus in accordance with the present invention.

The subject is not limited to this, and a polymer residue is listed up as another example. The polymer residue is generated as a reaction product at a time of a dry etching, and the polymer residue can be significantly effectively removed by using the water supplying apparatus in accordance with the present invention.

Both of the resist film removal and the polymer residue removal can be executed at the same time by using the water supplying apparatus in accordance with the present invention, however, can be, of course, separately executed.

In the water supplying apparatus in accordance with the present invention, there is provided with the means for supplying the water vapor body (in most cases, including the water vaporized in the gas) and the means for supplying the water mist body including the $H_2O$ fine particles, these two supplying means are independently controlled, and the water vapor body and the water mist body are directly supplied to the subject.

Accordingly, at a time of executing the process of removing the disused material such as the resist film or the like, it is possible to consider on the assumption of separating the process of supplying the water vapor body to the wafer and the process of supplying the water mist body to the wafer. At this time, it can be assumed that the water gas body is effective for changing its nature of the resist film or the like due to the permeation of the gas body, and the water mist body is effective for peeling the resist film or the like by the fine particles of the water.

For example, the resist film is formed in manufacturing the semiconductor device on the basis of a base polymer basic structure having a hole property and a hydrogen bonding property, and the resist film body generates physical changes such as softening, expansion or the like by the high-temperature water vapor body. Further, a resist permeability of the water vapor body is great, and the water vapor body generates physical changes such as swelling, separation, solidification or the like so as to generate a change in chemical structure. Accordingly, the resist film hydrated and swelled by the high temperature water vapor body so as to be softened has a weakened bonding force with the wafer and is going to be peeled. Further, an injection force or a spraying force of the nozzle apparatus at a time of supplying the water vapor body or the water mist body to the subject is applied so as to be largely effective for peeling the swelled resist and the wafer substrate.

The water mist body comes into collision with the particles attached on the surface at an injecting speed from the nozzle. A magnitude of the water mist body is set so that a diameter thereof is about 5 to 50 μm, and on the assumption, for example, of an injecting speed of about 40 m/second, a colliding force thereof is sufficient to peel the particles of 0.1 to a few μm from the wafer base substance.

Figure 4:
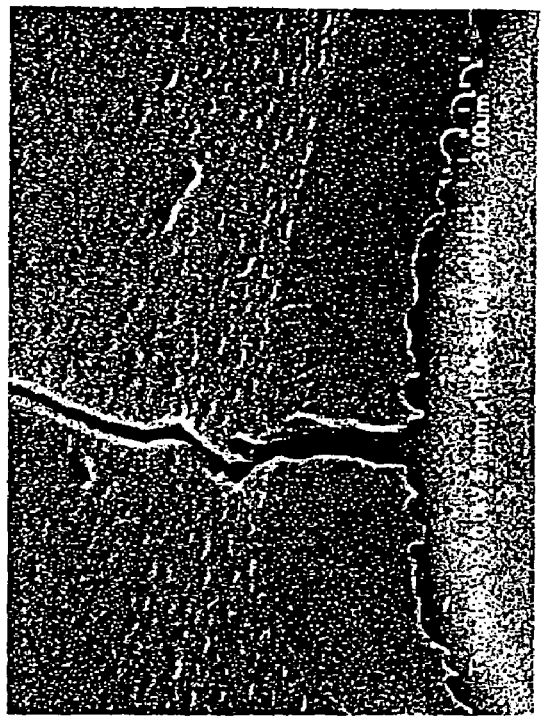
FIG. 4 is an enlarged photograph obtained by photographing a state that the resist film attached to the wafer changes its nature due to a process applied by the apparatus in accordance with the present invention, by using an electron microscope.
Figure 4:

FIG. 4 is an enlarged photograph obtained by photographing a state that the resist film attached to the wafer changes its nature at a time of executing the process by using the water supplying apparatus in accordance with the present invention, by using an electron microscope. As shown in a photograph (a), there can be seen that when the water vapor body is permeated, changes such as softening, expansion or the like of the resist film are promoted, a deformation and a gap are generated from a side of an end portion between the wafer and the resist film, and the bonding force is weakened.

Further, as shown in a photograph (b) showing the next stage of the photograph (a), due to a further permeation of the water vapor body, physical changes such as swelling, separation, solidification or the like further promote in the resist film body so as to generate a great crack or the like, and finally the resist film is peeled out from the wafer in cooperation with an operation of the water mist body.

Figure 5:
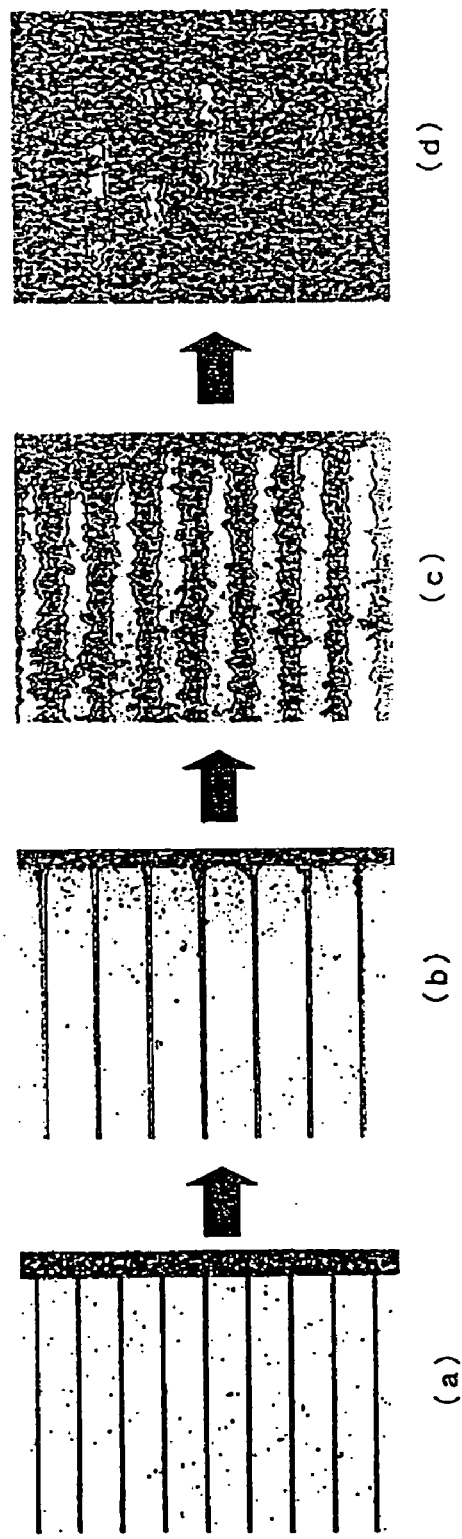
FIG. 5 is a photograph showing a state that the resist film attached to the wafer is peeled out so as to gradually pass out of existence.

FIG. 5 is a photograph showing a state that the resist film (pale color portions) attached to the wafer (deep color portions) is gradually reduced in an order of (a)→(b)→(c)→(d) and the resist film is peeled out so as to gradually pass out of existence, at a time of executing the process of removing the resist film by using the water supplying apparatus in accordance with the present invention.

FIG. 5 is the photograph in accordance with one embodiment of the present invention, however, in this case, the process of removing the resist film by using the apparatus in accordance with the present invention is executed on the basis of the following conditions. That is, a preset temperature of the water vapor body is 120°, a wafer placing table rotates at 4 rpm, a gap (a space) of the nozzle is 20 mm, and a flow rate of the pure water is 100 cc per a nozzle.

Figure 6:
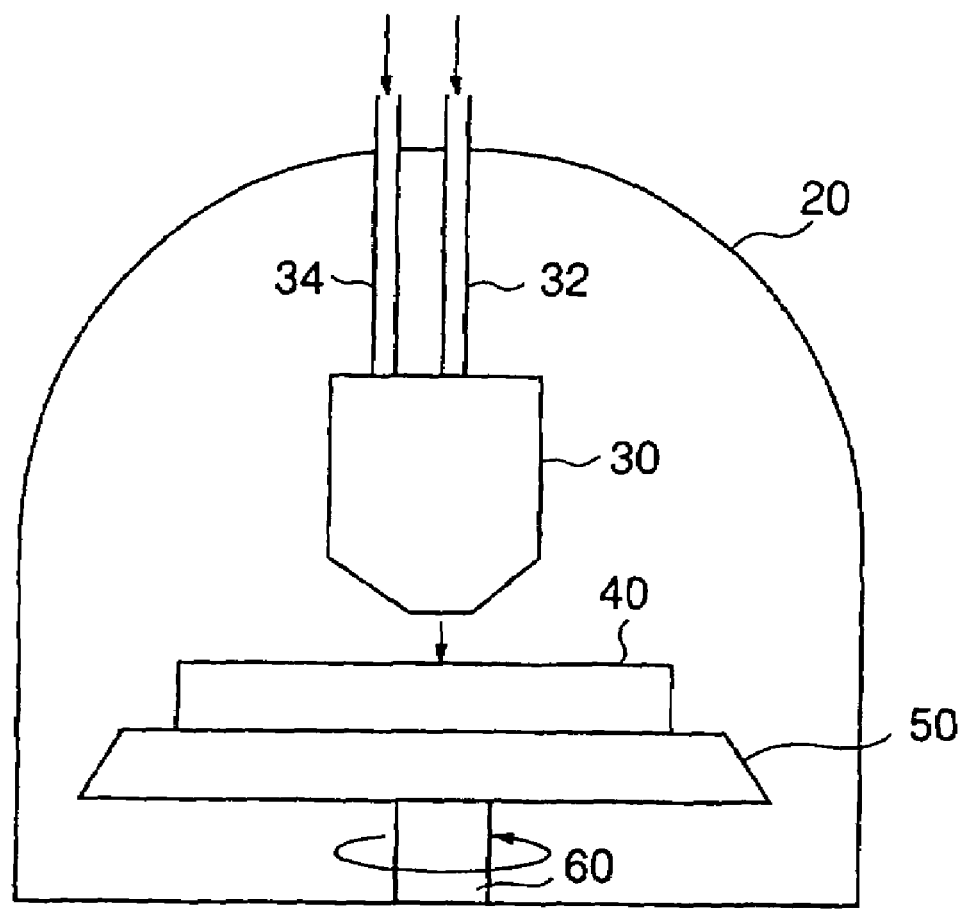
FIG. 6 is a view showing a schematic structure of a water supplying apparatus in accordance with the present invention.

FIG. 6 is a view showing one schematic structure of the water supplying apparatus in accordance with the present invention. A subject 40 such as a wafer or the like is placed on a rotating table 50 which rotates about a rotating shaft 60 within a processing chamber 20. A nozzle means 30 is arranged at a predetermined interval apart from the subject 40 so as to be opposed to the subject 40, and a flow passage 32 for supplying the water vapor body and a flow passage 34 for supplying the water mist body are mounted to the nozzle means 30.

At a time of removing the disused material such as the resist or the like, the water vapor body and the water mist body are injected from a front end of the nozzle means 30 by scanning the nozzle means 30 in a radial direction of the subject 40 while rotating the subject 40 at a predetermined speed so as to execute a peel-out and a removal.

In this case, the description is mainly given of removing the resist film and the polymer residue generated as the disused material in manufacturing the semiconductor electronic device in connection with the water supplying apparatus in accordance with the present invention. However, the range to which the water supplying apparatus in accordance with the present invention is applied is not limited to this, and includes a working process in other electronic devices or the like and a surface precision treating field, and further, the water supplying apparatus in accordance with the present invention is greatly effective in fields of cleaning a substrate, cleaning after a chemical mechanical polishing (CMP), cleaning a dry etching treated surface, cleaning a fine circuit, cleaning a mask for forming a fine circuit and the like.

As described above, in accordance with the present invention, since it is possible to independently control the supply conditions of the water vapor body and the water mist body, the peeling and removing capacities of the disused material such as the resist film or the like are high, and it is possible to realize the effective water supplying apparatus.

What is claimed is:

1. In a substrate processing chamber, a method for cleaning a substrate having one of a resist film and a polymer residue on a surface of said substrate, comprising:
   providing a water vapor producing arrangement that includes at least a heating arrangement for heating water to produce water vapor and a first aperture configured to supply said water vapor at a first temperature to said surface of said substrate; and
   providing a water mist producing arrangement including at least a second aperture configured to supply a water mist containing a gas and water particles to said surface of said substrate, said water mist being supplied to said surface substrate at a second temperature lower than said first temperature;
   supplying said water vapor to said surface of said substrate; and
   thereafter supplying said water mist to said surface of said substrate after supplying said water vapor has started, wherein said water mist is configured to at least partially peel said one of said resist film and said polymer residue.

2. The method of claim 1 further comprising supplying a gas along with least one of said water vapor and said water mist containing said water particles, said gas being supplied through said first aperture if said gas is supplied along with said water vapor, said gas being supplied through said second aperture if said gas is supplied along with said water mist.

3. The method of claim 1 further comprising selling said first temperature such that said water vapor becomes suitable for permeating one of a resist film and a polymer residue that is disposed on said substrate to accomplish said cleaning.

4. The method of claim 1 further comprising setting a flow rate of said water mist such that said water mist becomes suitable for physically peeling one of a resist film and a polymer residue that is disposed on said substrate.

5. The method of claim 1 wherein said first temperature is at least equal to a boiling point of said water.

6. The method of claim 5 wherein said second temperature is at most equal to said boiling point of said water.

7. In a substrate processing chamber, a method for cleaning a substrate having one of a resist film and a polymer residue on a surface of said substrate, comprising:
   providing a water vapor producing arrangement that is configured to supply water vapor to said surface of said substrate through a first nozzle, said water vapor being produced using water at a first water usage rate;
   providing a water mist producing arrangement configured to supply water mist to said surface of said substrate through a second nozzle different from said first nozzle, said water mist being produced using said water at a second water usage rate higher than said first water usage rate, thereby enabling said water mist to exert a greater peeling force on said surface of said substrate than a peeling force exerted by said water vapor; and
   simultaneously supplying said water vapor and said water mist to said surface of said substrate to at least partially clean said substrate with said water vapor and said water mist.

8. The method of claim 7 wherein said water vapor producing arrangement further includes a heating arrangement configured to furnish said water vapor at a first temperature that is higher than a second temperature associated with said water mist, thereby enabling said water vapor to permeate said one of said resist film and said polymer residue on said surface of said substrate to a greater extent than said water mist.

9. The method of claim 7 further comprising supplying a gas with said water vapor prior to subjecting said surface of said substrate to said water vapor, said gas being one of air, nitrogen, carbon dioxide, ozone, argon, and helium, said gas being ejected out of said first nozzle along with said water vapor at said surface of said substrate.

10. The method of claim 7 wherein said substrate processing chamber includes a pressure controlled inner portion capable of maintaining at least one of an atmospheric pressure state, a depressurized state, and a pressurized state.

11. The method of claim 7 wherein said water vapor producing arrangement further includes a heating arrangement that is configured to produce said water vapor at a first temperature that is at least equal to a boiling point of said water, and wherein said water mist producing arrangement is configured to produce said water mist at a second temperature that is at most equal to said boiling point of said water.

12. In a substrate processing chamber, a method for cleaning a substrate, comprising:

providing a water vapor producing arrangement that is configured to supply water vapor and a gas (water vapor/gas) at a first temperature to said surface of said substrate through a first nozzle, said water vapor being produced using water at a first water usage rate;

providing a water mist producing arrangement configured to supply water mist to said surface of said substrate through a second nozzle different from said first nozzle, said water mist being produced using said water at a second water usage rate higher than said first water usage rate, said water mist being at a second temperature that is lower than said first temperature; and simultaneously supplying said water mist and said water vapor/gas to said surface of said substrate to at least partially clean said substrate with said one of said water mist and said water vapor/gas.

13. The method of claim 12 wherein said gas is one of air, nitrogen, carbon dioxide, ozone, argon, and helium.

14. The method of claim 12 wherein said water mist is suitable for physically peeling from said surface of said substrate one of a resist film and a polymer residue.

15. The method of claim 12 wherein said water vapor/gas is suitable for permeating said one of a resist film and a polymer residue, said one of a resist film and a polymer residue being disposed on said surface of said substrate.

16. The method of claim 12 wherein said first temperature is at least equal to a boiling point of said water, and said second temperature is at most equal to said boiling point of said water.

* * * * *